United States Patent [19]
Salimian et al.

[11] Patent Number: 5,587,039
[45] Date of Patent: Dec. 24, 1996

[54] PLASMA ETCH EQUIPMENT

[75] Inventors: Siamak Salimian, Sunnyvale; Michelangelo Delfino, Los Altos; Bu-Chin Chung, Saratoga, all of Calif.

[73] Assignee: Varian Associates, Inc., Palo Alto, Calif.

[21] Appl. No.: 304,719

[22] Filed: Sep. 12, 1994

Related U.S. Application Data

[62] Division of Ser. No. 818,662, Jan. 9, 1992, Pat. No. 5,376,233.

[51] Int. Cl.⁶ .................................................. H01L 21/302
[52] U.S. Cl. .................. 156/345; 118/723 MW; 118/723 MR
[58] Field of Search ..................... 156/345, 643.1; 118/723 MW, 723 MA, 723 MR; 216/69

[56] References Cited

U.S. PATENT DOCUMENTS

| | | | |
|---|---|---|---|
| 5,024,716 | 6/1991 | Sato | 156/345 |
| 5,038,712 | 8/1991 | Fujiyama | 118/723 |
| 5,111,111 | 5/1992 | Stevens et al. | 315/111.21 |
| 5,234,526 | 8/1993 | Chen et al. | 156/345 |
| 5,376,223 | 12/1994 | Salimian et al. | 156/643 |

FOREIGN PATENT DOCUMENTS

| | | |
|---|---|---|
| 62-031112 | 2/1987 | Japan . |
| 63-226929 | 9/1988 | Japan . |
| 63-221621 | 9/1988 | Japan . |
| 1043950 | 2/1989 | Japan . |

*Primary Examiner*—R. Bruce Breneman
*Assistant Examiner*—George Goudreau

[57] ABSTRACT

A microwave powered electron cyclotron resonance reactor employing a low pressure, high electron density plasma for rapid oxide etching using hydrogen and argon incorporates an alumina-coated quartz dielectric microwave window to couple microwave energy into an etch chamber while preventing oxygen in the window from contaminating the etch chamber or its contents. The etch chamber side of the dielectric microwave window is coated with alumina.

6 Claims, 4 Drawing Sheets

P=1.0KW

P=1.2KW

P = 2.5 mT

RF BIAS = 0
DC BIAS = 0
T < 200 °C
2.3 < P < 4 mtorr
1375 > P > 1000 W

PLASMA ETCH EQUIPMENT

CROSS-REFERENCE TO RELATED APPLICATION

This application is a divisional of U.S. patent application Ser. No. 07/818,662 filed Jan. 9, 1992, now U.S. Pat. No. 5,376,223.

BACKGROUND OF THE INVENTION

The present invention relates to the manufacture of semiconductor integrated circuits, and more particularly to apparatus for ultra high purity plasma cleaning and ultra pure material epitaxy.

Ion bombardment of surfaces is an important aspect of plasma etching, reactive ion etching, and sputter deposition. Ion bombardment also is an important part of several analytical techniques such as secondary ion mass spectrometry (SIMS) and low energy ion scattering spectroscopy (LEIS). Auger electron spectrometry (AES) also employs low energy inert gas ions for physical sputtering to obtain erosion to support depth profiling. Although these have become very important processes, the ion induced surface chemistry and alteration of near surface chemical, physical and electronic characteristics are very complex and remain poorly understood processes. This has led to the empirical development of most commercial plasma assisted etching processes.

Plasmas are partially ionized quasi-neutral gases. They can be created in a vacuum chamber by applying enough electric field to ionize the gases. The power source may be a DC electric field, inductive RF coil, microwaves or a capacitively coupled RF electric field. Electrons have small mass relative to other particles so most of the energy gained in these systems is initially absorbed by the electrons. These high energy electrons collide with other particles and ionize the gas and sustain the plasma. The typical ionizing potential is high so that the majority of molecules and atoms stay neutral. Eventually a DC potential will build up between a plasma and any dielectric surface nearby, preventing any further imbalance.

In general, semiconductor processing plasmas are in a state of thermal non-equilibrium and are affected by the following: (a) Power—By increasing power absorbed the sheath potential is increased as well as the number of ions produced. Any wafer within the plasma will experience induced temperature increases from increased ion energy bombardment as well as increased ion flux. Obviously, more damage can be done to the substrate at higher powers.

(b) Pressure—At higher pressures, more gas molecules are available which is generally believed to result in higher ion flux. However, in our work we discovered a very sharp peak in production of excited hydrogen species at low pressure in our electron cyclotron resonance, (ECR) plasma generator. This discovery has enabled us to take advantage of this peak in obtaining very fast etching at low ion energy so that we avoid surface damage usually occurring with energetic ions. While such surface damage is expected with heavy ions, it has also been documented with light ions such as $H^+$.

(c) Device configuration—In ECR devices, parameters such as chamber geometry including positioning of the substrate, magnet configuration chamber materials and ion density uniformity will affect the etching process.

It is postulated that the explanation for the distinctly different etching rates of materials by various etchant gases has to do with the ability of the reactive gas molecule to penetrate into the surface being etched and to break the subsurface bond or lower the binding energy for the surface atoms and to replace that bond by bonding itself to the subsurface such that the released product is volatile at the temperature of release. It is believed that when an energetic ion strikes a solid, it transfers its energy to near surface atoms through a series of elastic collisions and electronic and vibrational processes. Collisional cascade effects can produce ion implantation, crystalline damage, ion mixing and physical sputtering. These effects can also result from low energy ion bombardment. Ion mixing is the process under which target atoms are relocated by ion impact, which process is broken up by recoil and cascade contributions. It is believed that mixing processes may be important in enhancing volatile product formation. This is distinct from sputtering in which near surface atoms receive enough momentum transfer perpendicular to the surface to overcome the surface potential barrier and thereby escape into the vacuum.

Two types of equipment are being most frequently used for plasma etching. One type of such apparatus employs a resonant cavity excited by RF fields to induce and sustain the plasma. These are relatively simple devices but a difficulty that they present is plasma density and ion energy cannot be separately controlled. Accordingly high ion energies cannot be curtailed in high power requirement situations. The conventional RF field, inductive or capacitively coupled, is characterized by low electron density and high plasma potential. Another type of plasma producing apparatus employs a microwave resonant cavity to produce plasma which is flowed out of the cavity to a remote area. This is called a downstream microwave plasma. Downstream microwave plasma is characterized by low electron density, low plasma potential, and high plasma pressure. For this reason, electron cyclotron resonance (ECR) microwave plasma apparatus have become more popular for etching application. The ECR apparatus can provide low pressure, high ion density at low ion energy and the ion energy can be controlled by substrate bias and the plasma potential is also low.

An electron in motion in a magnetic field is acted upon by the field to produce a force at right angles to the direction of motion of the electron. As a result, an electron entering a fixed magnetic field will follow a curved path. The radius of curvature is an inverse function of the intensity of the magnetic field. The frequency of electron rotation, w, is expressed as $w=2.8 \times 10^6$ B cycles/sec where B is in gauss. This is known as the electron cyclotron resonance frequency. We have designed our ECR plasma generator to employ a magnetic field of 875 gauss and the corresponding cyclotron frequency of 2.45 GHz.

In recent years, the demands for reducing line widths and increasing device density in integrated circuits has forced the industry towards a manufacturing device called the integrated cluster tool. The integrated cluster tool is a multichamber vacuum system, in which the working chambers are arranged around a central transfer chamber and in which each working chamber is separated from the central transfer chamber by a pair of gate valves forming a vacuum lock. During operation, a semiconductor wafer can be processed in a working chamber, while the remainder of the cluster apparatus is isolated from the environment of any of the other working chambers. After a wafer treatment is completed in a particular working chamber, the wafer is able to be automatically passed to the transfer chamber through a double gate valve and then automatically passed to a subsequent working chamber through another double gate valve. This integrated cluster tool permits a plurality of various vacuum working chambers to be "clustered" around the central transfer chamber and permits the processing of a wafer through many of its most demanding processes without any requirement for the wafer to be passed back into ambient or clean room air. It has been proven that it is impractical and almost impossible, to control the particulate count in a clean room to the tolerances demanded by the density of modern integrated circuits.

Because of the increasing importance of cluster tools, it is becoming commercially important to decrease the time required for each process step on a wafer. In the past, many wafers were processed simultaneously in large furnaces. Because of the high vacuum requirements and mechanical transfer requirements, a cluster tool working module generally processes only one wafer at a time. Although duplicate identical modules can be clustered around a transfer chamber, it is seen that the cluster tool device is essentially a serial processing system and that the process time of each step will have a direct affect on the overall throughput rate.

SUMMARY OF THE INVENTION

We have discovered a process using a high density, low sheath potential, low pressure $H_2$ or $H_2/Ar$ plasma to very rapidly etch silicon oxide from silicon while passivating the silicon surface. Our process will completely remove native oxide from a silicon surface, without damage to the subsurface, in less than 60 seconds. We have determined that it is important to remove from or passivate sources of oxygen in the plasma chamber. To this end we have coated the microwave window of our ECR chamber. By combining our ECR oxide cleaning processes with an integrated cluster tool, we are able to pass an ultra clean Si wafer to a nitriding furnace without oxide regrowth and then subsequently grow a stoichiometric $Si_3N_4$ layer on Si which exceeds the purity of previously grown silicon nitride layers.

It is an object of this invention to provide an improved ECR process for low temperature, rapid ECR plasma cleaning of silicon oxide.

It is a further objective to provide a silicon oxide cleaning process which is fast enough to support commercial production of integrated circuit wafers in an integrated cluster tool.

It is a still further objective to provide an ECR silicon oxide cleaning process which in conjunction with a cluster tool and a nitride furnace enables a process for the growth of stoichiometric $Si_3N_4$ films with less than 0.01 at % oxygen, hydrogen and carbon.

DETAILED DESCRIPTION OF THE INVENTION

Those of ordinary skill in the art will realize that the following description of the present invention is illustrative only and is not intended to be in any way limiting. Other embodiments of the invention will readily suggest themselves to such skilled persons from an examination of the within disclosure.

Figure 1:
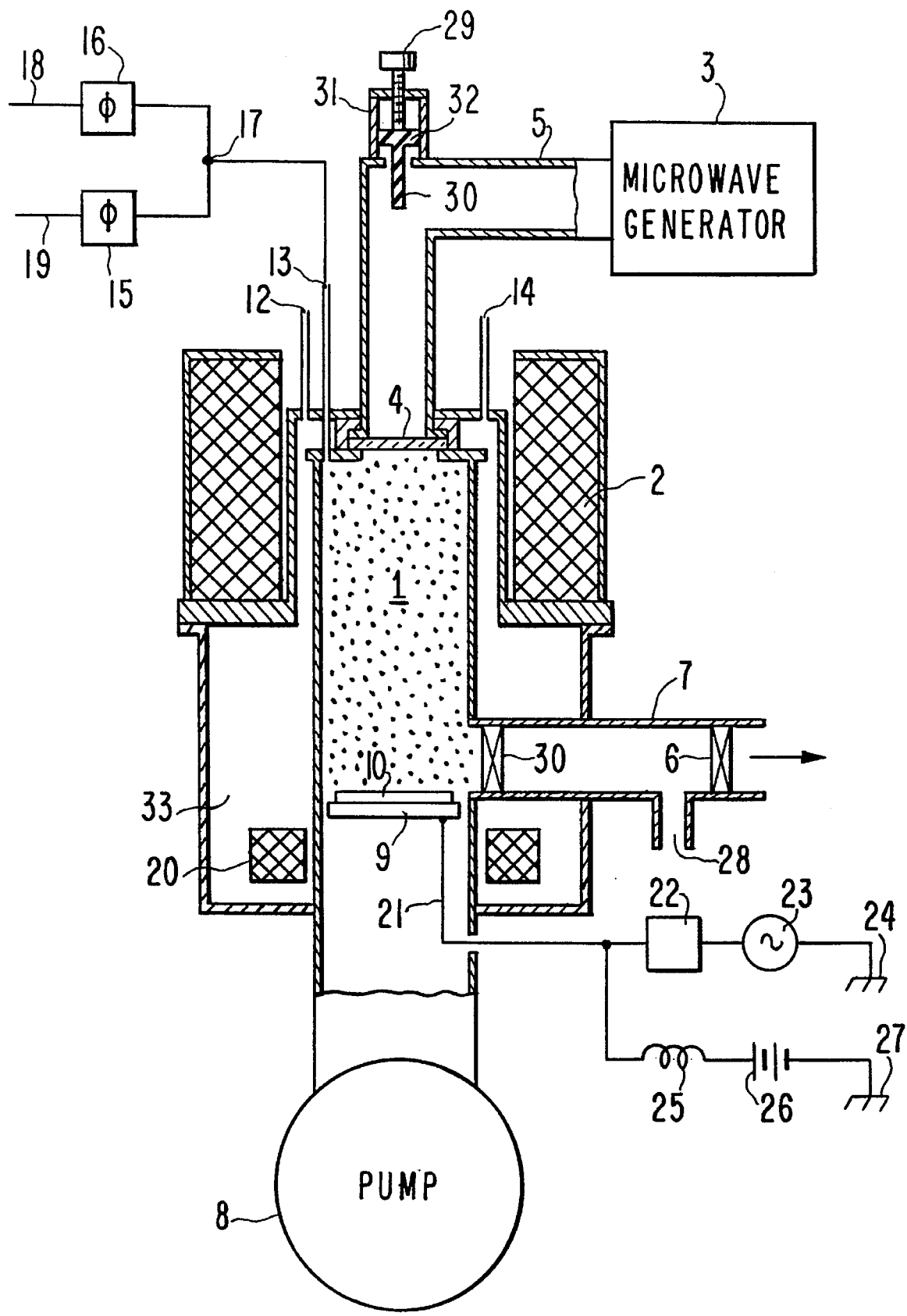
FIG. 1 is a schematic of an ECR plasma apparatus.
Figure 2:
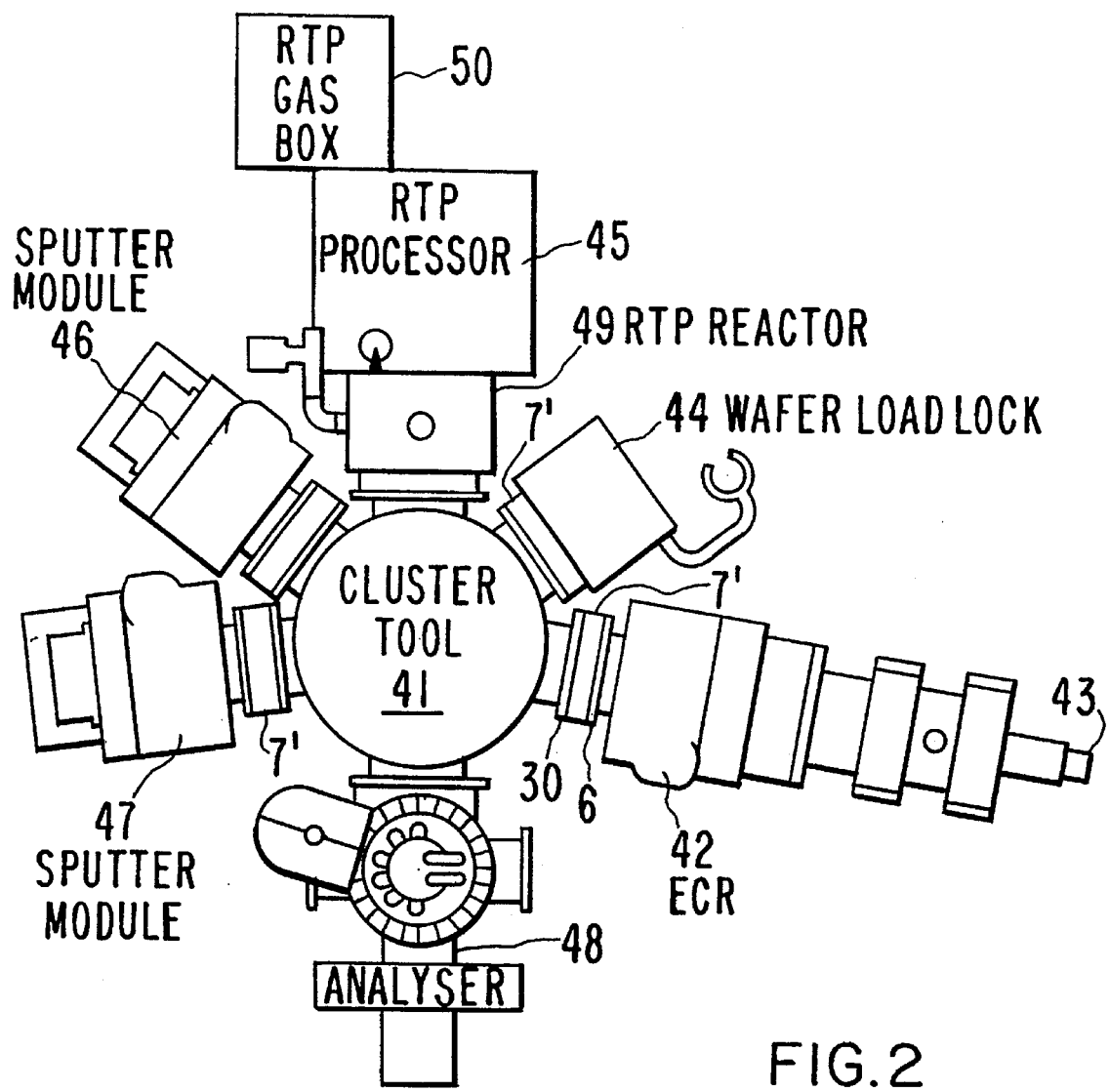
FIG. 2 is a diagram of a typical integrated cluster tool.

With reference to FIG. 1, there is shown a schematic diagram of a plasma chamber device improved by us and used in our inventive processes. We need a low pressure, high density electron, low sheath potential plasma for our work and we have employed an ECR reactor to provide the plasma. Electron cyclotron resonance is induced in chamber 1 by the imposition of microwave at the proper cyclotron resonance frequency from RF generator 3 via waveguide 5, past tuner 31 where the microwaves are introduced into the chamber through microwave dielectric window 4. The magnetic field from magnet 2 causes the electrons in the gases in chamber 1 to rotate at the same frequency as the microwaves such that the electrons are very quickly able to absorb energy from the microwaves. One magnet coil 2 is shown for illustration purposes. More than one such magnetic is employed in our preferred embodiment but this is not significant in respect to our invention. Excited electrons violently impact molecules of any gas in the chamber and if conditions of pressure and power are correct, many gas molecules will become ionized, producing a quasi-neutral plasma wherein some molecules are ionized by having their electrons knocked off and other molecules are slightly energized while remaining uncharged. The gases for sustaining the plasma and for supporting the various reactions which take place in the chamber 1 are introduced through one or more tube 13 into the chamber. Surrounding the chamber 1 is an annular fluid chamber 33 for cooling the chamber 1. Tubes 12 and 14 carry the coolant fluid in and out of the coolant chambers. The gas input tube 13 is shown connected to a mixing "T", 17, which is coupled two or more mass flow controllers 15 and 16 connected in parallel for controlling the flow rate from gas sources connected to two or more corresponding input lines 18 and 19. The wafer 10 is shown mounted to a substrate holder 9, which may have coolant and heating conduits (not shown), both of which are mounted in the plasma column. The axial position of the substrate holder 9 is adjustable and is an empirical adjustment for each gas employed. A field focussing magnet 20 may be mounted beneath the substrate holder 9 to change the magnet field lines in an effort to make the ion flux density uniform across the chamber diameter in the treatment area. Shown connected to the bottom of the chamber 1 is a large capacity high vacuum pump 8. Also shown connected to the substrate holder via electrical connector 21 are the electrical circuits for biasing the wafer 10. An RF bias generator 23 and an RF matching network 22 are connected in parallel with a DC bias circuit containing an inductor 25 and a DC potential source 26. Also shown is the interconnecting transfer chamber to the cluster tool of FIG. 2 which contains a pair of vacuum gate valves 30 and 6 for separating the cluster tool from the ECR plasma chamber 1. All wafers 10 are introduced and removed from the chamber 1 by a transfer arm from the cluster tool 41 (FIG. 2) which passes through the pair of gate valves, 30 and 6. With reference to FIG. 2, the ECR 42 is shown connected to a modern cluster tool 41 for passing wafers back and forth for processing. Shown connected to the cluster tool through a dual gate valve 7' are other modules such as a rapid thermal processor (RTP) reactor 49, connected to a RTP processor 45 and RTP gas box 50. Also connected to the cluster tool through a dual gate valve 7' is a pair of sputter modules 46 and 47 that are used to deposit metallization for integrated circuit current paths. In the research environment we have also connected an analytical module 48 including an x-ray photoelectron spectrometer (XPS) and a static secondary ion mass spectrometer (SSIMS). The limitation upon the number of module that can be connected to the periphery of the current models of cluster tools is determined by the diameter of the aperture required for the dual gate valve 7' and the size of periphery of the cluster tool. The gate valve diameter is determined by diameter of the wafers to be processed.

Figure 3:
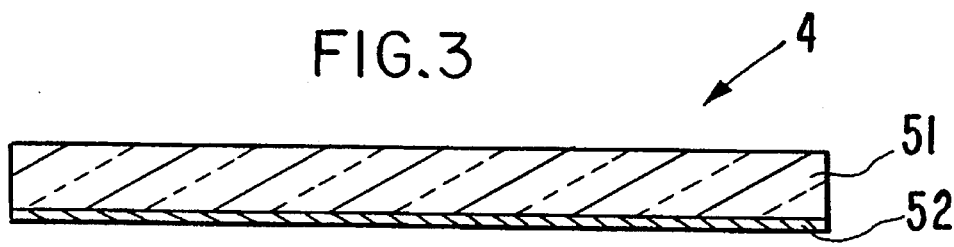
FIG. 3 is a microwave window for the ECR apparatus.

The preferred embodiment of window 4 is shown in FIG. 3 with greater particularity. The side of the window 4 facing the plasma chamber is shown to be coated by a material which is resistive to etching by the gas(es) employed in the plasma chamber. The dielectric disk 51 is frequently quartz. However, we have discovered that this common window substance is rather quickly etched by the excited H species employed in our oxide etching processes. The oxygen removed from the quartz is frequently redeposited as an oxide on the silicon surface of the wafer 10 being processed. In order to avoid this problem, it is important to eliminate as many sources of oxygen as possible from the reactor during oxide etch. Accordingly, we have used a window which is not etchable by our plasma gases, or is coated or passivated so as to eliminate introduction of oxygen in the chamber during etch. The ECR reactor chamber materials are stainless steel, i.e. 31655, aluminum and alumina.

In our embodiment, we employed a 3 mil thick layer 52 of a flame sprayed alumina, $AlO_x$, on the microwave window quartz disk 51. This layer has proven to permit the microwaves to pass through into the chamber with low reflective loss and the layer is able to readily dissipate the heat on its surface and to preclude release of oxygen. In the preferred embodiment, the window cooling is also aided by the annular flowing cooling fluid at its periphery.

With the ECR equipment described in connection with FIG. 1, FIG. 2 and FIG. 3 we have discovered a plasma process employing pure hydrogen or hydrogen mixed with a small percentage of argon buffer gas, which will remove a native oxide layer rapidly, with no wafer bias, i.e., in under 4 minutes with pure $H_2$ and under 1 minute with $H_2$ and 5 at % Ar, at low temperature, i.e., less than 200° C. The native oxide is under 25 Å thick and we have verified that essentially complete oxide removal was affected in these times by employing an in-situ x-ray photoelectron spectrometer (XPS) and in-situ static secondary ion mass spectrometer (SSIMS).

Through experiments, we have discovered that a 100 at % $H_2$ gas plasma with a plasma pressure of 2.5 mT exhibited an unexpected peak in the production of excited $H^+$ species, including $H^+$, $H_2^+$ and thermally excited neutral $H_2$. We have also discovered that there is a very sharp increase in the rate of $SiO_2$ removal which occurs in our apparatus above 600 watts of net microwave power where net power is (incident-reflected) power. We have demonstrated that our high removal rates occur with no discernable damage to the underlying silicon. The etch time of 4 minutes with pure hydrogen was obtained at 1.2 KW microwave power and the etch time of 1 minute with 5 at % Ar and 95 at % $H_2$ was, obtained at 1.37 KW. The operating base pressure was $7 \times 10^{-8}$ torr. We expect that our 1 minute native oxide etch time is a viable alternative for a commercial process simply because of its short required exposure time.

Figure 4:
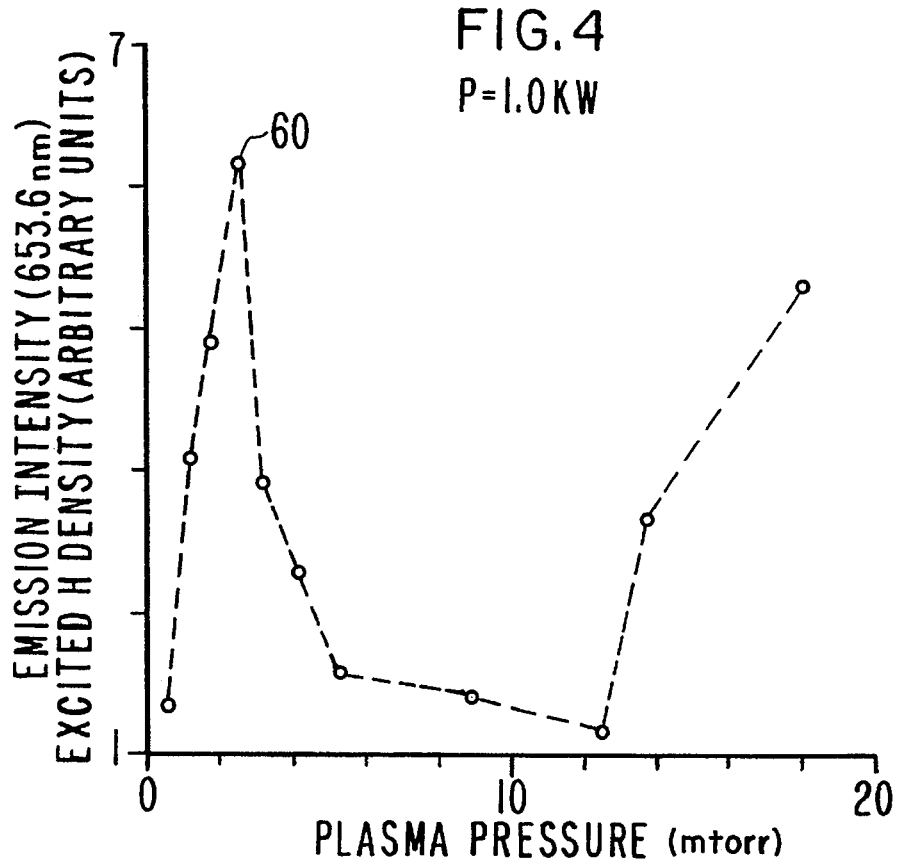
FIG. 4 is a curve showing excited H density as a function of plasma pressure.

With reference to FIG. 4, we have plotted test results taken in our ECR chamber which show a sharp peak 60 in excited H species at a particular plasma pressure, i.e., 2.5 mtorr. These results were obtained at a constant 1.0 KW and were obtained by measuring relative emission intensity of the hydrogen atomic 653.6 nm line. This assumes that this line emission arises from the excitation of ground state atoms. The peak 60 of FIG. 4 corresponds to the pressure at the point 61 of maximum etch rate shown in FIG. 5. The excited H species peak apparently coincides with the maximum in the concentration of electrons, at the same plasma pressures. High electron density, i.e. greater than $1 \times 10^{11}$ electrons/cm$^3$, is apparently required to obtain the number of hydrogen ions required for our process.

Figure 5:
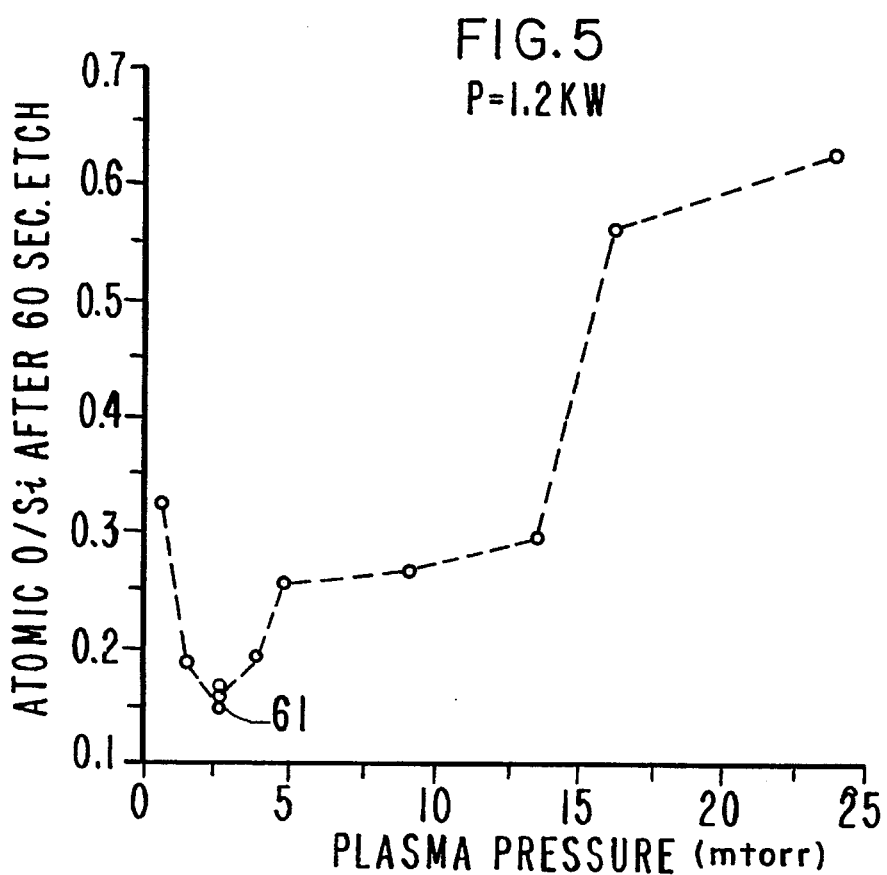
FIG. 5 is a curve showing O/Si ratio as a function of plasma pressure.

The effect of plasma pressure on the atomic oxygen to silicon ratio after a 60 second ECR exposure is shown in FIG. 5. The parabolic shaped minimum 61 at 2.5 mtorr reflects the amount of oxygen removed, i.e. lowest O/Si ratio. Thereafter, the oxygen removal rate is relatively insensitive to pressure until around 14 mtorr when it abruptly decreases. When the original native O/Si ratio is 0.63, it means that no oxide is being removed at those pressures. The O/Si ratio was obtained using a Surface Science X-ray photoelectron spectrometer. The integrated oxygen 1s transition is at 532.4 eV, normalized with respect to the silicon concentration derived from the core-level Si2s transition at 151 eV and is called the O/Si ratio after applying appropriate sensitivity factors measured with $SiO_2$.

Figure 6:
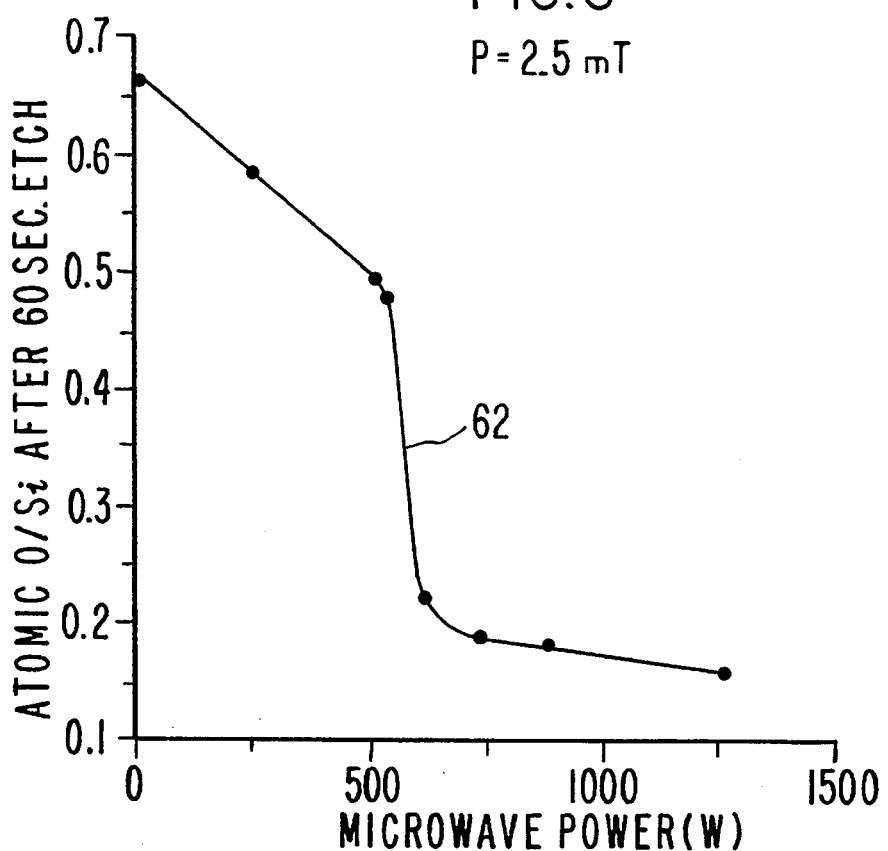
FIG. 6 is a curve showing O/Si ratio as a function of microwave power.

There is an unexpected discontinuity, 62, in the relationship of the O/Si ratio versus the net microwave power for a 60 sec. exposure at a constant 2.5 mtorr pressure as shown by FIG. 6. Two distinct regimes of oxygen removal rate are separated by a sharp transition near 600 watts. The relative insensitivity of the oxygen removal rate at the power levels above 1.0 KW is of practical significance in that it permits wide process latitude at high power.

We also noted that the surfaces etched by our process were apparently passivated by hydrogen bonding to the Si surface bonding sites. Specifically, an ECR $H_2$ plasma cleaned wafer will not absorb any $O_2$ or $H_2O$ when stored for 72 hours at $3 \times 10^{-9}$ torr although a small amount of carbon absorption was detected. When exposed to room ambient for 5 minutes the O/Si of our treated wafer ratio grew to only 0.025. This slow rate of oxide formation is beneficial in commercial handling. A negative secondary ion mass spectrum of the ECR $H_2$ plasma cleaned Si surface shows $^1H^-$ as the most intense peak. This is an order of magnitude greater than the next highest peak (28 Si $^{16}O)^-$. The intensity ratio of $^1H^-/^{16}O$ and $^1H^-/12C^-$ is 20 and 32 respectively. With regard to molecular species, the intensity ratio are $^1H^-/(^{28}Si\ ^1H)^-$ equal to 23 and $^{16}O^-/(^{28}Si\ ^{16}O)^-$ equals 27. Since the very stable $(^{16}O\ ^1H)^-$ is not detected, we conclude that the large majority of hydrogen and oxygen atoms are bonded directly to silicon and that the cleaned surface is covered with hydrogen and contaminated with less than $10^{15}$ O atoms/cm$^2$ and $10^{16}$C atoms/cm$^2$. We detect an apparent absence of a significant amount of hydrogen diffusing into the Si lattice during cleaning which we attribute to be a consequence of the low ion energy and the lower substrate temperature than used by prior workers.

Figure 7:
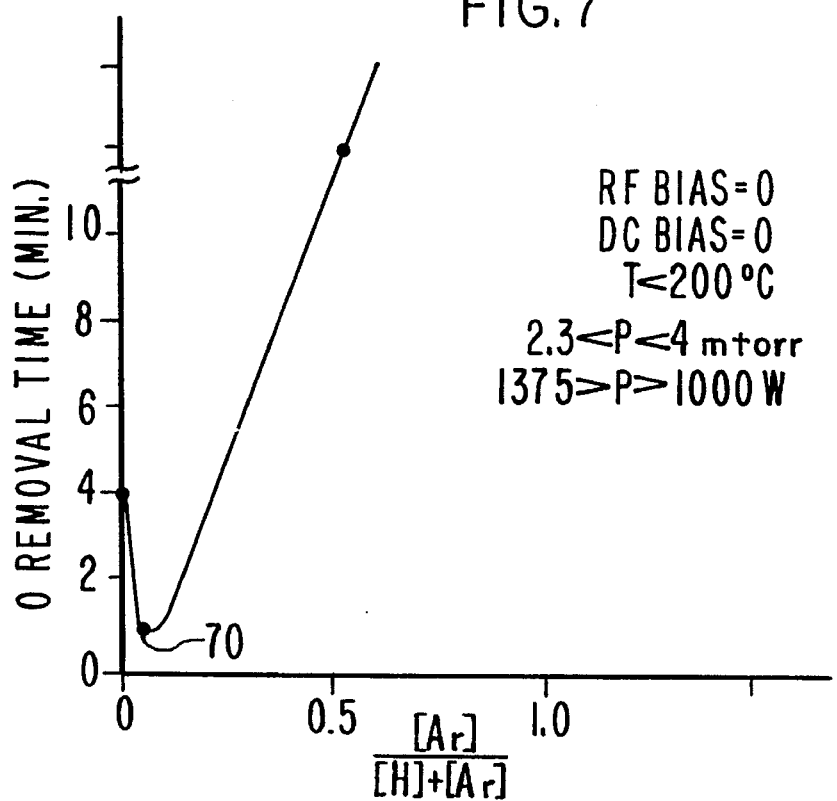
FIG. 7 is a curve showing O removal time as a function of Ar/H atomic percent ratio.

FIG. 7 demonstrates the relationship we have discovered between the etch time to reach an O/Si=O for $H_2$ plasma etch of approximately 25 Å thick native oxide as a function of atomic percent of argon in the plasma at constant zero bias. The point, 70, of maximum etch rate occurs at 5 at % Argon and is around 25 Å/minute. Not only have we determined that a small amount of argon such as 5 atomic percent reduced the native oxide etch time for pure $H_2$ plasma from 240 seconds to 60 seconds, but we also observe more stability in the plasma with this small amount of argon. Flow rates of $H_2$ and Ar in the experiment were 15 and 1 standard cubic centimeters per min (SCCM) or about 7% flow rate ratio. The partial pressures in a gas mixture are a measure of their relative flow rate. The sum of partial pressures equals the total pressure. Accordingly, the sum of the hydrogen partial pressure [H] plus argon partial pressure [Ar] is equal to the total pressure. The ratio, $$\frac{[Ar]}{[H]+[Ar]}$$

of argon pressure to the total pressure is a measure of atomic percentage.

The net microwave power was slightly higher for the Ar/$H_2$ gas at 1375 watts for the maximum etch rate and the pressure was approximately p=4.0 mtorr. We also noted for thermally produced oxide that the max. etch rate for the 5% Argon/$H_2$ mixture occurred at 2.2 mtorr.

Employing the improved ECR plasma chamber and processes of this invention has enabled us to obtain an ultra clean silicon surface which is passivated by hydrogen. We have discovered that in conjunction with a cluster tool of the type disclosed that such an ECR plasma cleaned silicon wafer can have grown thereon an ultra pure stoichiometric $Si_3N_4$ film with less than 0.01 at % oxygen, hydrogen and carbon on <111> and <100> silicon. The two step process consists of cleaning the surface in an ECR excited $H_2$ plasma and passing the wafer, in vacuum, to a second module where it is exposed to $NH_3$ for 2 minutes at 1070° C. to promote nitration. The films produced on <111> Si are approximately 5 nm thick with refractive index of 2.01 at 633 nm. These films are resistant to dry $O_2$ for six hours at 1050° C. and the average breakdown fields of a capacitor made from such films by layering Al on the surface is around 9 MV/cm. In all prior work of which we are aware, $Si_3N_4$ films on Si have been contaminated with O, H or C. The ultra purity of our layers has been verified by in-situ x-ray photoelectron spectroscopy and in-situ static secondary ion mass spectroscopy (SSIMS) used in combination with sputter depth profiling.

Our nitridation experiments were carried out in a Varian M2000 single wafer, multi-chamber cluster tool according to FIG. 2. The silicon wafer sample was a 12.5 cm diameter, n-type, 0.1 ohm-cm, <111> Si which was exposed for 10 minutes to an ECR excited $H_2$ plasma. The microwave power was 1.0 KW and the plasma pressure was 2.5 mtorr.

After cleaning, the substrate was transferred, in vacuum, to a rapid temperature process module 45 (FIG. 2) where it was ramped in temperature at 30° C./sec to 1070° C. and held there for 2 minutes in $NH_3$ at 17 torr pressure. The chamber base pressure is at $2\times10^{-7}$ torr. Afterward the nitrided Si wafer was transferred in vacuum to an analytical module where XPS and SSIMS data was taken sequentially. Transfer between modules was done at $8\times10^{-8}$ torr and completed within 1 minute.

A depth profile was generated by tracking N 1s, Si 2p, Si 2s, O 1s, and C 1s transitions after intermittent Ar-ion sputtering at 3 keV. No discernable O 1s, or C 1s transition was observed during depth profiling. Assuming XPS sensitivity of 0.1 at %, this result shows an order of magnitude improvement in purity over earlier work. In addition, both positive ($^{1}H$, $^{12}C$, $^{14}N$, $^{28}Si$, $^{29}Si$, $^{30}Si$) and negative ($^{1}H$, $^{16}O$) secondary ion mass intensities were recorded with Ar ion-gun operating in a static mode, with current density estimated at 0.2 nA/cm$^2$. The $^{12}C^+$, $^{1}H^-$, and $^{16}O^-$ intensities never exceeded 30% of the vacuum background. Assuming reasonable secondary ion sensitivity factors suggests less than 0.01 at % impurities in the film. Circular Al/$Si_3N_4$/Si capacitors, 200 μm in diameter, were fabricated in contact openings containing 3 μm thick 1 thermal oxide. A typical current-voltage diagram measured with a positive bias applied to the Al electrode was characterized by a breakdown field of 9 MV/cm assuming a 5 nm film thickness. The films had current densities around $10^{-4}$ A/cm$^2$ at 3 V. The breakdown is as much as 3 MV/cm lower and the leakage current several order of magnitude higher than other thermal $Si_3N_4$ layers. It is not yet clear whether this characteristic is due to the high purity of the film.

Another embodiment of this invention for use in connection with tungsten and titanium metallization is described as follows. Tungsten metallization is highly desirable for high density IC fabrication. However, it has been difficult to deposit these refractory metals directly on Si because of a residual layer of oxide on the active Si surfaces. Accordingly complex silicide forming processes or deposition of $WSi_x$ or $T_iSi_x$ have been necessary as an intermediate layer between the silicon and the refractory metal. Because above-described etching process results in an oxygen, carbon and nitrogen ultra oxide free surface, we believe that we may be successful in depositing and obtaining good ohmic contacts with refractory metals without a requirement for producing or depositing an intermediate silicide.

While illustrative embodiments and applications of this invention have been shown and described, it would be apparent to those skilled in the art that many more modifications than have been mentioned above are possible without departing from the inventive concepts set forth herein. The invention, therefore, is not to be limited except in the spirit of the appended claims.

We claim:

1. In an ECR plasma processing apparatus having a microwave generator coupled to a plasma generating chamber, said plasma generating chamber being disposed in a magnetic field, the maximum intensity of said magnetic field being aligned with the axis of said plasma generating chamber, an interior region of said plasma generating chamber being isolated from said microwave generator by a dielectric microwave window having a first face and a second face, said first face forming an interior wall of said interior region and said second face being parallel to said first face, the improvement comprising:

said first face of said dielectric microwave window coated with a layer of alumina to preclude plasma etching of and release of oxygen from said first face; and said second face of said dielectric microwave window formed of a quartz dielectric material.

2. An ECR processing apparatus according to claim 1 wherein said layer of alumina is at least about 3 mils thick.

3. An electron cyclotron resonance reactor comprising:

a microwave generator having a microwave output;

a reactor chamber; and said microwave output coupled to said reactor chamber through a dielectric microwave window, said dielectric microwave window comprising a first side forming an interior wall of said reactor chamber and a second side parallel to said first side, said microwave window formed of quartz, said first side including an alumina coating having a thickness of at least about 3 mils.

4. An electron cyclotron resonance reactor according to claim 3 wherein said dielectric microwave window has a constant cross sectional shape along an axis orthogonal to said first side and said second side.

5. An electron cyclotron resonance reactor comprising:
a microwave generator having a microwave output;
a reactor chamber; and
said microwave output coupled to said reactor chamber through a dielectric microwave window, said dielectric microwave window comprising a first side forming an interior wall of said reactor chamber and a second side parallel to said first side, said microwave window formed of quartz, said first side including an alumina coating.

6. An electron cyclotron resonance reactor according to claim 5 wherein said dielectric microwave window has a constant cross sectional shape along an axis orthogonal to said first side and said second side.

* * * * *